(12) United States Patent
Kim et al.

(10) Patent No.: US 10,020,073 B2
(45) Date of Patent: Jul. 10, 2018

(54) MEMORY DEVICE AND OPERATING METHOD THEREOF

(71) Applicant: SK hynix Inc., Gyeonggi-do (KR)

(72) Inventors: Tae-Kyun Kim, Gyeonggi-do (KR); Jae-Il Kim, Gyeonggi-do (KR); Hee-Seong Kim, Gyeonggi-do (KR); Jun-Gi Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 90 days.

(21) Appl. No.: 15/059,057

(22) Filed: Mar. 2, 2016

(65) Prior Publication Data

US 2017/0052840 A1 Feb. 23, 2017

(30) Foreign Application Priority Data

Aug. 19, 2015 (KR) ........................ 10-2015-0116728

(51) Int. Cl.
*G06F 11/00* (2006.01)
*G11C 29/50* (2006.01)
*G11C 11/406* (2006.01)
*G11C 11/408* (2006.01)
*G11C 29/04* (2006.01)
*G11C 29/44* (2006.01)

(52) U.S. Cl.
CPC ...... *G11C 29/50016* (2013.01); *G11C 11/408* (2013.01); *G11C 11/4087* (2013.01); *G11C 11/40611* (2013.01); *G11C 2029/0409* (2013.01); *G11C 2029/4402* (2013.01); *G11C 2211/4061* (2013.01); *G11C 2211/4062* (2013.01)

(58) Field of Classification Search
CPC .................................................. G06F 11/0793
USPC ........................ 714/6.11, 6.1, 6.13, 718, 719
See application file for complete search history.

(56) References Cited

U.S. PATENT DOCUMENTS

| 7,697,360 | B2 | 4/2010 | Dono et al. | |
|---|---|---|---|---|
| 2004/0264259 | A1* | 12/2004 | Hayashi | G11C 29/808 365/189.05 |
| 2005/0076274 | A1* | 4/2005 | Nagai | G06F 11/1008 714/718 |
| 2015/0006994 | A1* | 1/2015 | Kim | G11C 7/08 714/763 |
| 2015/0074489 | A1* | 3/2015 | Kashiwagi | G11C 7/10 714/763 |

FOREIGN PATENT DOCUMENTS

KR 1020150002112 1/2015

* cited by examiner

*Primary Examiner* — Dieu-Minh Le
(74) *Attorney, Agent, or Firm* — IP & T Group, LLP

(57) ABSTRACT

A memory device may include: a plurality of memory cells; at least one address storage unit; a fail detection unit suitable for comparing first and second read data that are read from at least one memory cell selected among the plurality of memory cells to detect a fail, and storing an address of the selected memory cell in the address storage unit when the fail is detected; and a refresh control unit suitable for refreshing the memory cell corresponding to the address stored in the address storage unit at a higher frequency than the other memory cells.

18 Claims, 15 Drawing Sheets

MEMORY DEVICE AND OPERATING METHOD THEREOF

CROSS-REFERENCE TO RELATED APPLICATIONS

The present application claims priority of Korean Patent Application No. 10-2015-0116728, filed on Aug. 19, 2015, which is incorporated herein by reference in its entirety.

BACKGROUND

1. Field

Various embodiments of the present invention relate to a memory device and an operating method thereof.

2. Description of the Related Art

Memory devices include a plurality of memory cells. A memory cell of a memory device, for example, a DRAM, includes a transistor serving as a switch and a capacitor for storing electrical charges corresponding to data. A logic level of the data, which may be high (logic level 1) or low (logic level 0), may depend on the amount of the charges stored in the capacitor.

While data are stored in the form of charges in a memory cell capacitor, theoretically there is no loss of data or current consumption. However, due to a leakage current the charges and therefore the data may be degraded or lost. In order to prevent data loss, memory cells should be read and recharged periodically before the stored data in the capacitor is lost. The operation of reading and recharging the memory cells is commonly referred to as a refresh operation.

In a typical refresh operation, a memory controller applies a refresh command to the memory device repeatedly at a predetermined period which takes into consideration the data retention time of the memory device. For example, when the data retention time of the memory is 64 ms, the entire memory cells in the memory device may be refreshed according to 8,000 times of applications of the refresh command, that is, the memory controller applies 8,000 refresh commands to the memory device for 64 ms. Furthermore, when the data retention times of some memory cells included in the memory device is determined not to reach the predetermined refresh period in a test process employed during manufacturing, the memory device may be considered as defective and may be discarded. When all memory devices including memory cells having insufficient retention times are discarded, the manufacturing yield inevitably decreases.

Furthermore, data retention times of memory cells may be degraded due to a number of factors even after manufacturing, so that memory cells may cause errors even though the memory device may have passed the manufacturing test process.

SUMMARY

Various embodiments are directed to a memory device capable of performing a refresh operation to normally operate memory cells having a short data retention times, and an operating method thereof.

In an embodiment, a memory device may include: a plurality of memory cells; at least one address storage unit; a fail detection unit suitable for comparing first and second read data that are read from at least one memory cell selected among the plurality of memory cells to detect a fail, and storing an address of the selected memory cell in the address storage unit when the fail is detected; and a refresh control unit suitable for refreshing the memory cell corresponding to the address stored in the address storage unit at a higher frequency than the other memory cells.

In an embodiment, a memory device may include: a plurality of rows coupled to a plurality of memory cells; at least one address storage unit; a refresh counter suitable for generating a counting address; a fail detection unit suitable for comparing first and second read data that are read from at least one selected memory cell coupled to a row corresponding to the counting address to detect a fail, and storing the counting address in the address storage unit when the fail is detected; and a refresh control unit suitable for refreshing a row corresponding to the stored counting address at a higher frequency than the other rows.

In an embodiment, there is provided an operating method of a memory device which includes a plurality of memory cells. The operating method may include: selecting at least one memory cell; first reading data of the selected memory cell; second reading the data of the selected memory cell after a predetermined time elapses; comparing the first read data and the second read data to detect a fail; storing an address of the selected memory cells when the fail is detected; and refreshing the memory cell corresponding to the stored address at a higher frequency than the other memory cells.

DETAILED DESCRIPTION

Figure 1:
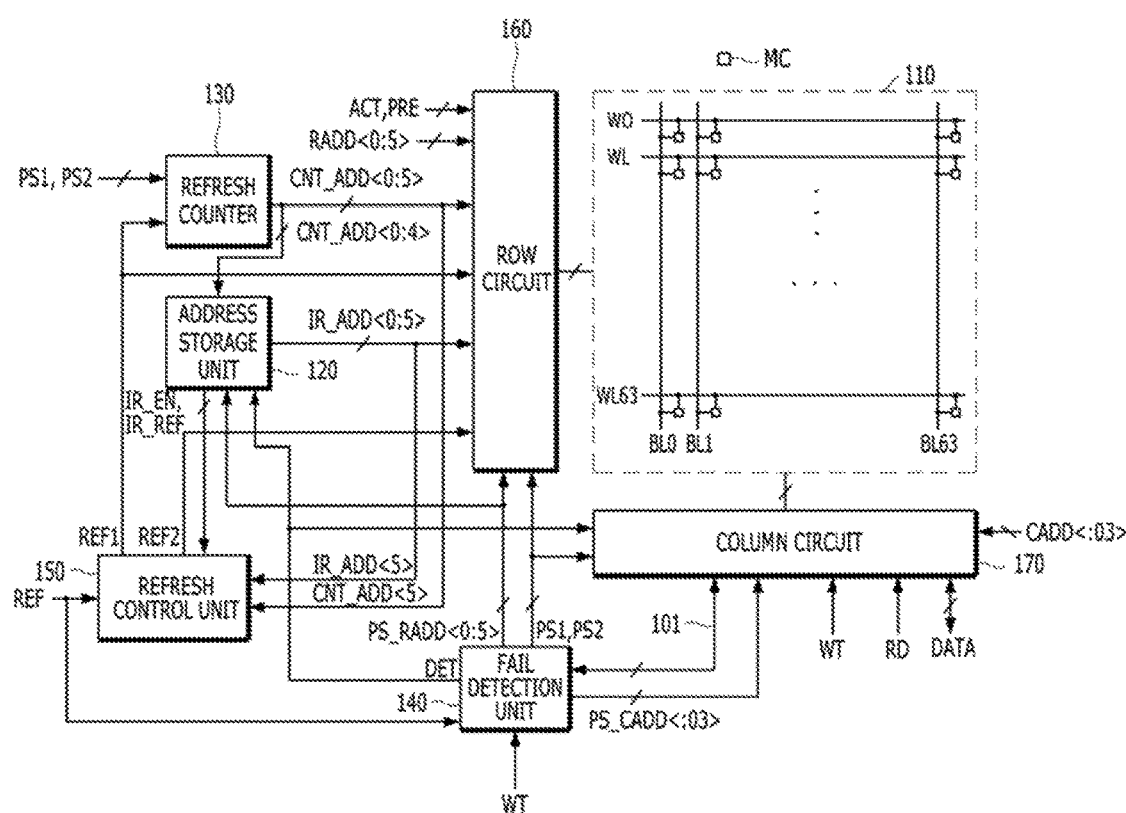
FIG. 1 is a diagram illustrating a memory device, according to an embodiment of the present invention.

Various embodiments will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereafter, a first refresh operation may indicate a normal refresh operation which sequentially refreshes all word lines included in a cell array (i.e., memory bank) once during a refresh period (tRFC) regulated in the specification for a memory device, and a second refresh operation may indicate an additional refresh operation (IR operation) that is additionally performed so that a word lined, detected as a word line corresponding to a memory cell having a short data retention time, may retain data.

Referring to FIG. 1, a memory device according to an embodiment of the present invention is provided. The memory device may include a cell array 110, an address storage unit 120, a refresh counter 130, a fail detection unit 140, a refresh control unit 150, a row circuit 160, and a column circuit 170.

The cell array 110 may include a plurality of rows (i.e., word lines) WL0 to WL63, a plurality of columns (i.e., bit lines) BL0 to BL63, and a plurality of memory cells MCs coupled between the rows and the columns. The numbers of the rows, the columns, and the memory cells may be changed according to design.

The address storage unit 120 may store a first detection address PS_RADD<0:5> when a detection signal DET is activated. The address storage unit 120 may activate an additional refresh (IR) enable signal IR_EN when storing one or more addresses, and deactivate the IR enable signal IR_EN when storing no addresses.

The address storage unit 120 may compare predetermined bits SADD0<0:4> to SADD3<0:4> of the stored addresses to predetermined bits CNT_ADD<0:4> of a counting address, activate an additional refresh (IR) flag signal IR_REF when the predetermined bits SADD0<0:4> to SADD3<0:4> are equal to the predetermined bits CNT_ADD<0:4>, and output an address which is equal to predetermined bits of the counting address, among the stored addresses SADD0<0:5> to SADD3<0:5>, as an additional refresh (IR) address IR_ADD<0:5>.

The refresh counter 130 may generate the counting address CNT_ADD<0:5> by performing counting whenever a first refresh signal REF1 is activated. The refresh counter 130 may increase the value of the counting address CNT_ADD<0:5> by one, whenever the first refresh signal REF1 is activated. When the value of the counting address CNT_ADD<0:5> is increased by one, it may indicate that the counting address CNT_ADD<0:5> is changed to select a (K+1)th word line next time in a case where a Kth word line is selected this time. When either a first or a second patrol scrubbing signal PS1, PS2 is activated, the refresh counter 130 may not perform counting so that the value of the counting address CNT_ADD<0:5> remains the same.

The fail detection unit 140 may compare first and second read data from one or more memory cells selected among the memory cells MCs of the cell array 110, and determine whether a fail has occurred in the selected memory cells. The first and second read data may indicate data read from the same memory cells at two different times separated with a predetermined time difference.

The fail detection unit 140 may latch the first read data from selected memory cells, and compare the second read data from the same memory cells to the latched data. Then, the fail detection unit 140 may determine that no fail has occurred, (deactivate the detection signal DET) when the second read data are equal to the latched data, or determine that a fail has occurred (i.e., activate the detection signal DET) when the second read data are different from the latched data. When a fail is detected, the fail detection unit 140 may control the column circuit 170 to write the latched data to the selected memory cells.

The fail detection unit 140 may generate first and second detection addresses PS_RADD<0:5>, PS_CADD<0:3>. A first detection address PS_RADD<0:5> may indicate the row address, and the second detection address PS_CADD<0:3> may indicate the column address of memory cells for which a fail is detected. In an embodiment, the fail detection unit 140 may increase the second detection address PS_CADD<0:3> by one whenever the fail detection operation for the selected memory cells is completed, and increase the first detection address PS_RADD<0:3> by one when the second detection address PS_CADD<0:3> is reset after reaching the last value. Alternatively, in another embodiment, the fail detection unit 140 may increase the first detection address PS_RADD<0:5> by one whenever the fail detection operation for the selected memory cells is completed, and increase the second detection address PS_CADD<0:3> by one when the first detection address PS_RADD<0:5> is reset after reaching the last value.

The detection operation of the fail detection unit 140 may be divided into two sub-operations. A first sub-operation may read data of selected memory cells for the first time and latch the read data. The second sub-operation may read data of the selected memory cells for the second time, compare the read data to the data latched during the first sub-operation, detect whether or not a fail has occurred, and write the latched data to the selected memory cells when a fail has occurred.

The fail detection unit 140 may generate the first and second patrol scrubbing signals PS1 and PS2 using a result obtained by counting a refresh signal REF. The first patrol scrubbing signal PS1 may be activated for the first sub-operation, and the second patrol scrubbing signal PS2 may be activated for the second sub-operation. The activation interval between the first and second patrol scrubbing signals PS1 and PS2 may be set to a predetermined time taking into account a refresh period.

The refresh control unit 150 may activate the first refresh signal REF1 in response to the refresh signal REF which is activated when a refresh command is inputted. Furthermore, the refresh control unit 150 may compare the counting address CNT_ADD<5> to the IR address IR_ADD<5> when the IR enable signal IR_EN and the IR flag signal IR_REF are activated. Then the refresh control unit 150 may activate a second refresh signal REF2 in response to the refresh signal REF, only when the counting address CNT_ADD<5> is different from the IR address IR_ADD<5>.

The row circuit 160 may control an active and precharge operation of a word line selected by a row address RADD<0:5>, the counting address CNT_ADD<0:5>, the IR address IR_ADD<0:5>, or the first detection address PS_RADD<0:5>. The row circuit 160 may activate a word line corresponding to the row address RADD<0:5> in response to an active signal ACT activated when an active command is inputted. The row circuit 160 may precharge the activated word line in response to a precharge signal PRE activated when a precharge command is inputted.

The row circuit 160 may refresh a word line corresponding to the counting address CNT_ADD<0:5> when the first refresh signal REF1 is activated and the first and second patrol scrubbing signals PS1 and PS2 are deactivated. The row circuit 160 may activate or precharge a word line corresponding to the first detection address PS_RADD<0:5> when the first refresh signal REF1 is activated and the first or second patrol scrubbing signal PS1 or PS2 is deactivated. The row circuit 160 may refresh a word line corresponding to the IR address IR_ADD<0:5> when the second refresh signal REF2 is activated.

The column circuit 170 may read data of memory cells MCs coupled to bit lines selected by a column address CADD<0:3> in response to a read signal RD which is activated when a read command is inputted, and write data to the memory cells MCs coupled to the bit lines selected by the column address CADD<0:3> in response to a write signal WT which is activated when a write command is inputted. DATA represents data inputted to or outputted from the cell array 110 through the column circuit 170.

The column circuit 170 may read the data of the memory cells MCs coupled to the bit lines selected by the second detection address PS_CADD<0:3> when the first or second patrol scrubbing signal PS1 or PS2 is activated. The column circuit 170 may write the data of the fail detection unit 140 to the memory cells MCs coupled to the bit lines selected by the second detection address PS_CADD<0:3> when the second patrol scrubbing signal PS2 and the detection signal DET are activated.

In FIG. 1, reference numeral '101' represents a plurality of lines for transmitting various signals between the fail detection unit 140 and the column circuit 170. For example, the column circuit 170 may select four bit lines at a time in response to the column address CADD<0:3> or the second detection address PS_CADD<0:3>.

Figure 2:
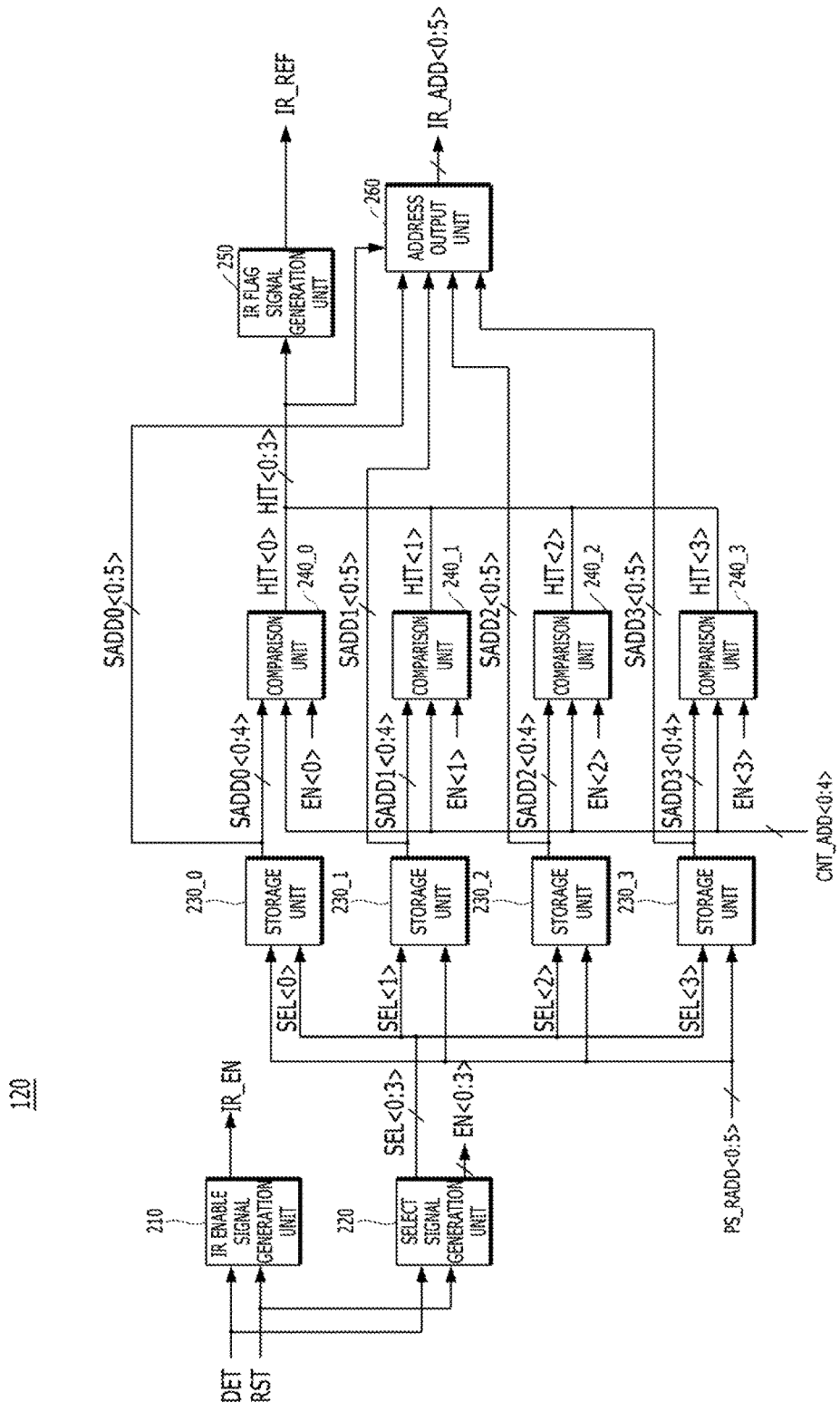
FIG. 2 is a detailed diagram of an address storage unit shown in FIG. 1, according to an embodiment of the present invention.

Referring to FIG. 2, an example of an address storage unit 120 is provided. The storage unit 120 may include an IR enable signal generation unit 210, a select signal generation unit 220, first to fourth storage units 230_0 to 230_3, first to fourth address comparison units 240_0 to 240_3, an IR flag signal generation unit 250, and an address output unit 260.

Figure 3A:
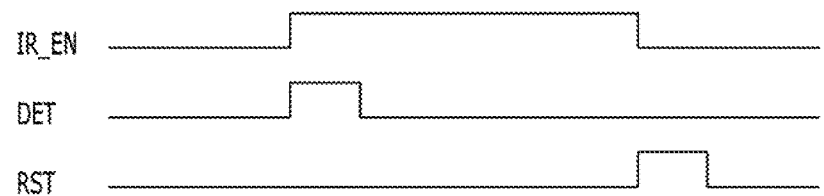
FIG. 3A is a timing diagram for describing an operation of an IR enable signal generation unit shown in FIG. 2, according to an embodiment of the present invention.

The IR enable signal generation unit 210 may activate the IR enable signal IR_EN in response to the detection signal DET, and deactivate the IR enable signal IR_EN in response to a reset signal RST. The IR enable signal IR_EN may be maintained in an active state from when the detection signal DET is activated for the first time to when the reset signal RST is activated as illustrated in the timing diagram of FIG. 3A.

The select signal generation unit 220 may generate select signals SEL<0:3>, and change a select signal to activate it when a detection signal DET is activated. For example, the select signal generation unit 220 may activate the select signal SEL<0> when the detection signal DET is activated for the first time, activate the select signal SEL<1> when the detection signal DET is activated for the second time, activate the select signal SEL<2> when the detection signal DET is activated for the third time, and activate the select signal SEL<3> when the detection signal DET is activated for the fourth time.

Figure 3B:
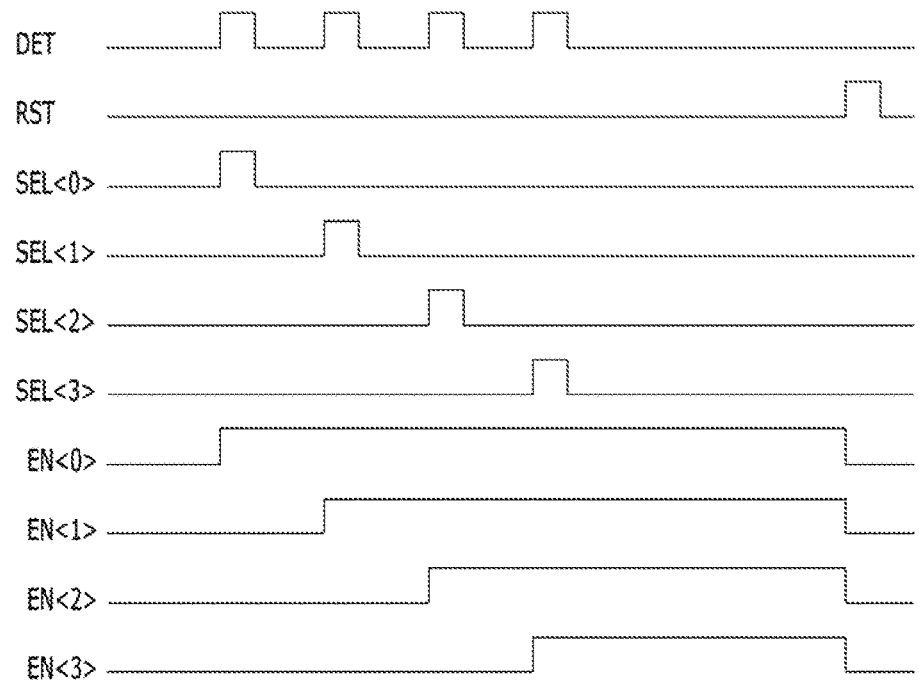
FIG. 3B is a timing diagram for describing an operation of a select signal generation unit shown in FIG. 2, according to an embodiment of the present invention.

The select signal generation unit 220 may activate an enable signal corresponding to an activated select signal, among enable signals EN<0:3>. The select signal generation unit 220 may be reset when the reset signal RST is activated. Thus, the select signals SEL<0:3> and the enable signals EN<0:3> may be reset to their initial states as illustrated in the timing diagram of FIG. 3B.

Each of the storage units 230_0 to 230_3 may store the first detection address PS_RADD<0:5> when a corresponding select signal among the select signals SEL<0:3> is activated. For example, the storage units 230_0 to 230_3 may correspond to the select signals SEL<0> to SEL<3>, respectively.

When the enable signals EN<0> to EN<3> are activated, the address comparison units 240_0 to 240_3 may compare the predetermined bits SADD0<0:4> to SADD3<0:4> of the addresses stored in the corresponding storage units to the predetermined bits CNT_ADD<0:4> of the counting address, and generate first to fourth hit signals HIT<0:3>, respectively. The address comparison units 240_0 to 240_3 may activate the hit signals HIT<0:3> when the predetermined bits SADD0<0:4> to SADD3<0:4> are equal to the predetermined bits CNT_ADD<0:4>, and deactivate the hit signals HIT<0:3> when the predetermined bits SADD0<0:4> to SADD3<0:4> are different from the predetermined bits CNT_ADD<0:4>.

The IR flag signal generation unit 250 may activate the IR flag signal IR_REF when one or more hit signals among the hit signals HIT<0> to HIT<3> are activated. The IR flag signal generation unit 250 may deactivate the IR flag signal IR_REF when all of the hit signals HIT<0> to HIT<3> are deactivated.

The address output unit 260 may output the address of an address storage unit corresponding to an activated hit signal HIT<0> to HIT<3> as the IR address IR_ADD<0:5>. The IR address IR_ADD<0:5> may indicate an address for selecting a word line to perform the second refresh operation.

Figure 4:
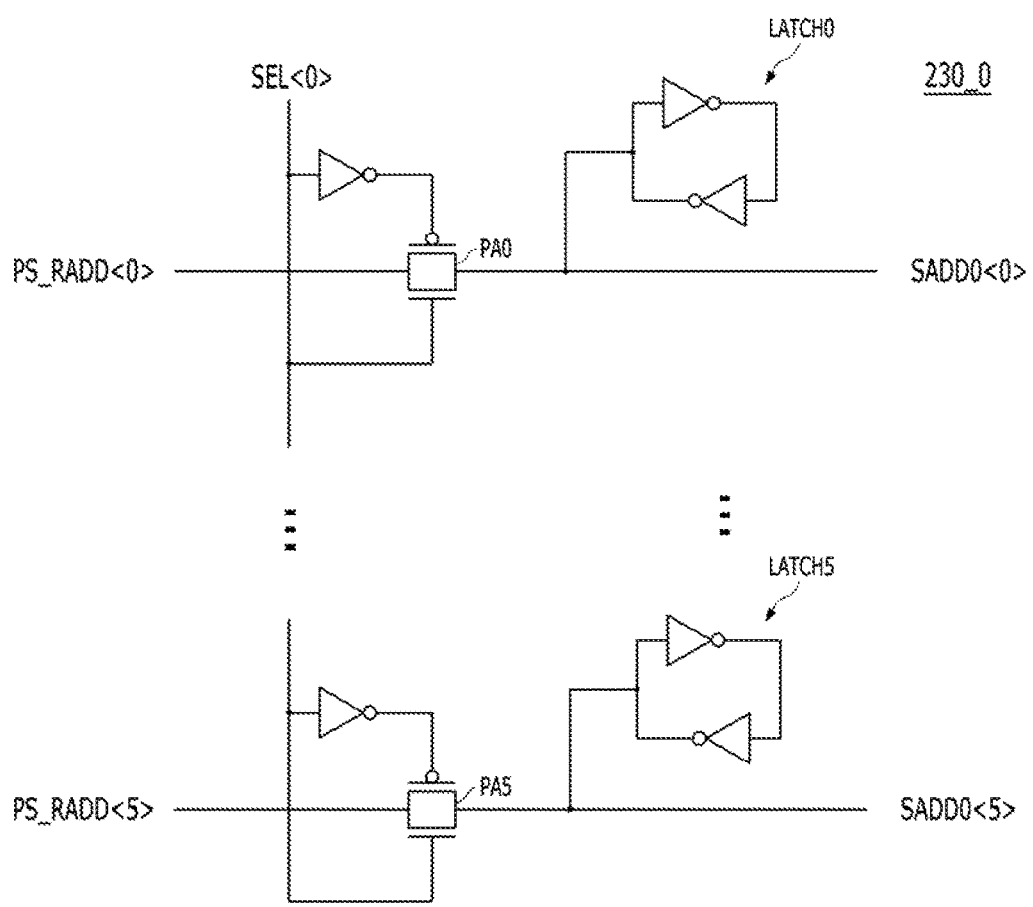
FIG. 4 is a detailed diagram of a storage unit shown in FIG. 2, according to an embodiment of the present invention.

FIG. 4 provides an example of a first storage unit 230_0 shown in FIG. 2.

Referring to FIG. 4, the storage unit 230_0 may include transmission gates PA0 to PA5 and latches LATCH0 to LATCH5. The transmission gates PA0 to PA5 may transmit address bits when the select signal SEL<0> is activated, and latches LATCH0 to LATCH5 may store transmitted address bits transmitted through corresponding transmission gates PA0 to PA5, respectively. The other storage units 230_1 to 230_3 may be configured and operated in the same manner as the storage unit 230_0, except that the transmission gates are turned on in response to the select signals SEL<1> to SEL<3>.

Figure 5:
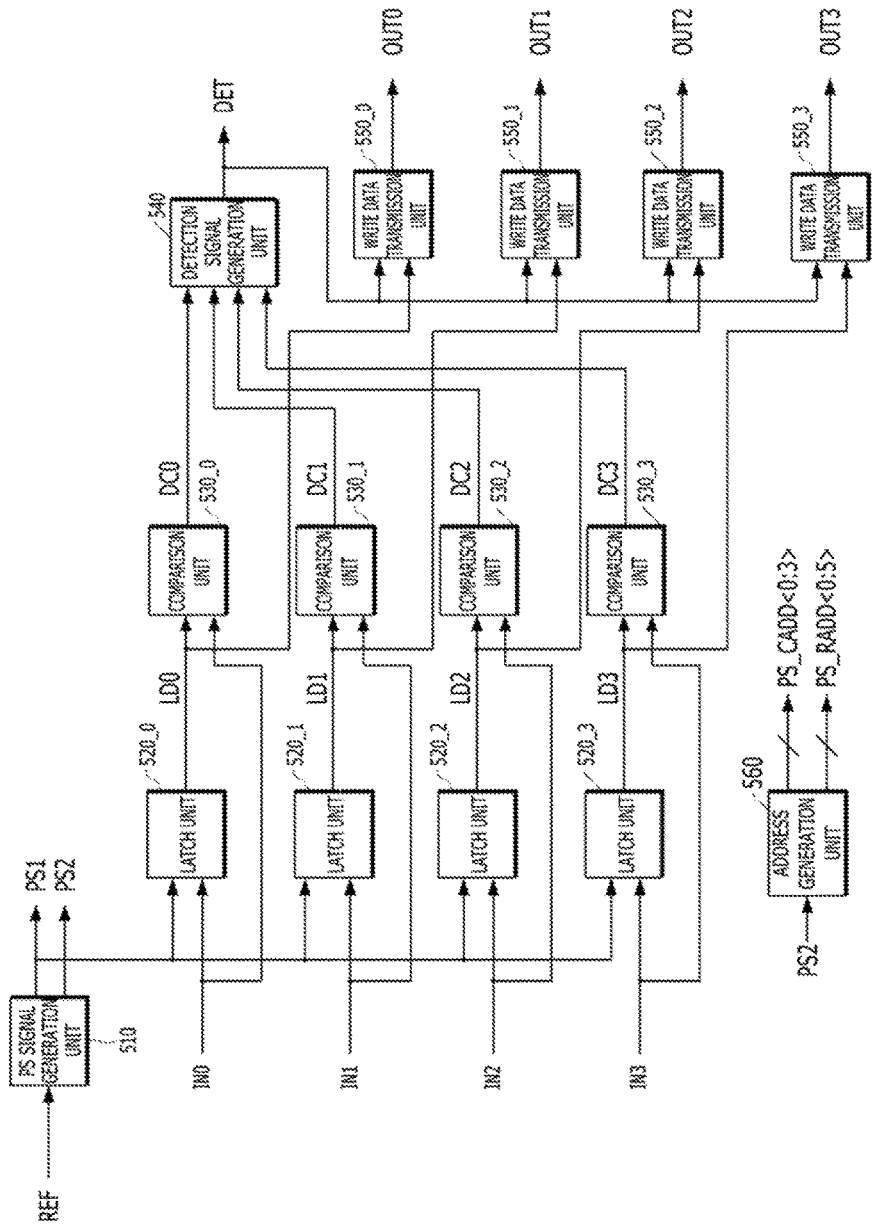
FIG. 5 is a detailed diagram of a fail detection unit shown in FIG. 1, according to an embodiment of the present invention.

FIG. 5 is a detailed diagram of an example of the fail detection unit 140 shown in FIG. 1.

Referring to FIG. 5, the fail detection unit 140 may include a PS signal generation unit 510, first to fourth data latch units 520_0 to 520_3, first to fourth data comparison units 530_0 to 530_3, a detection signal generation unit 540, first to fourth write data transmission units 550_0 to 550_3, and an address generation unit 560. In FIG. 5, IN0 to IN3 represent lines through which data inputted to the fail detection unit 140 are transmitted, and OUT0 to OUT3 represent lines through which data outputted from the fail detection unit 140 are transmitted. For reference, the lines 101 shown in FIG. 1 may include the input and output lines IN0 to IN3 and OUT0 to OUT3.

The PS signal generation unit 510 may activate the first patrol scrubbing signal PS1 when a value obtained by counting the number of times the refresh signal REF is activated corresponds to a first value, and activate the second patrol scrubbing signal PS2 when the value corresponds to a second value. The PS signal generation unit 510 may first activate the first patrol scrubbing signal PS1, and then alternately activate the first and second patrol scrubbing signals PS1 and PS2 during a predetermined period.

The data latch units 520_0 to 520_3 may correspond to the lines IN0 to IN3, respectively, and latch data transmitted to the corresponding lines IN0 to IN3 when the first patrol scrubbing signal PS1 is activated. The data of the lines IN0 to IN3 may include the data which are read from the selected memory cells MCs for the first time or the first read data. The data latch units 520_0 to 520_3 may output the latched data LD0 to LD3.

The data comparison units 530_0 to 530_3 may compare the data LD0 to LD3 outputted from the corresponding data latch units to the data transmitted to the corresponding lines IN0 to IN3, and output the comparison results DC0 to DC3. The data comparison units 530_0 to 530_3 may activate the comparison results DC0 to DC3 (for example, a logic low level) when the data LD0 to LD3 are equal to the data of the lines IN0 to IN3. The data comparison units 530_0 to 530_3 may deactivate the comparison results DC0 to DC3 (for example, a logic high level) when the data LD0 to LD3 are different from the data of the lines IN0 to IN3.

The detection signal generation unit 540 may deactivate the detection signal DET when the comparison results DC0 to DC3 are deactivated, that is, when the first read data (i.e., the data latched in the data latch units 520_0 to 520_3) are equal to the second read data (i.e., the data of the line IN0 to IN3). The detection signal generation unit 540 may activate the detection signal DET when one or more signals of the comparison results DC0 to DC3 are activated, that is, when the first read data are different from the second read data.

When the write signal WT is activated in a state where the second patrol scrubbing signal PS2 and the detection signal DET are activated, the write data transmission units 550_0 to 550_3 may transmit the data LD0 to LD3 outputted from the corresponding data latch units to the corresponding lines OUT0 to OUT3. The data transmitted to the lines OUT0 to OUT3 may be written to the selected memory cells MCs through the column circuit 170.

The address generation unit 560 may generate first and second detection addresses PS_RADD<0:5>, PS_CADD<0:3>. A first detection address PS_RADD<0:5> may indicate the row address, and the second detection address PS_CADD<0:3> may indicate the column address of memory cells for which a fail is detected. In an embodiment, the address generation unit 560 may increase the second detection address PS_CADD<0:3> by one whenever the fail detection operation for the selected memory cells is completed (at the time point where the patrol scrubbing signal PS2 is deactivated after being activated), and increase the first detection address PS_RADD<0:3> by one when the second detection address PS_CADD<0:3> is reset after reaching the last value. Alternatively, in another embodiment, the address generation unit 560 may increase the first detection address PS_RADD<0:5> by one whenever the fail detection operation for the selected memory cells is completed (at the time point where the patrol scrubbing signal PS2 is deactivated after the patrol scrubbing signal PS2 is activated), and increase the second detection address PS_CADD<0:3> by one when the first detection address PS_RADD<0:5> is reset after reaching the last value.

Figure 6:
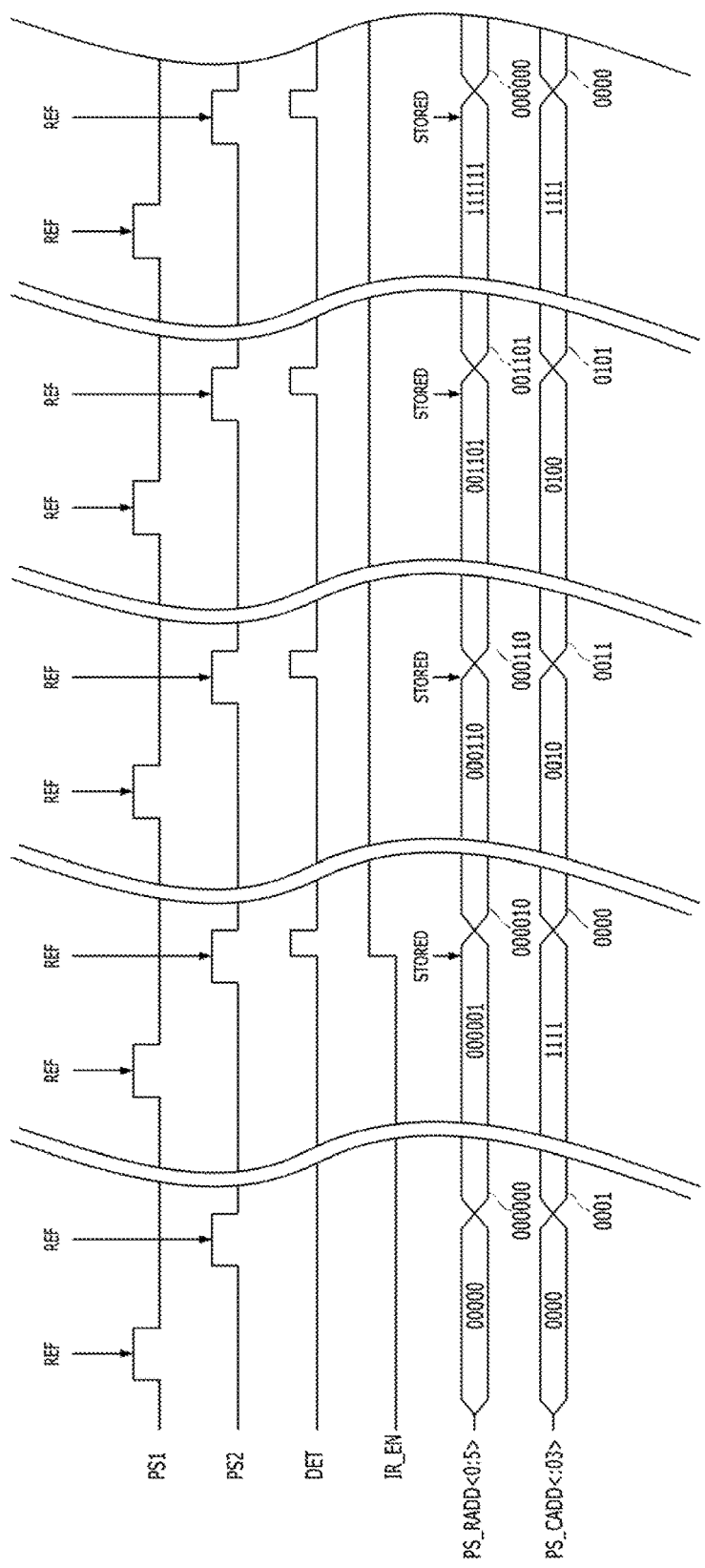
FIG. 6 is a timing diagram for describing a detection operation of the memory device shown in FIG. 1, according to an embodiment of the present invention.

FIG. 6 is a timing diagram for describing the detection operation of the memory device shown in FIG. 1.

Referring now to FIG. 6, a detection operation of a memory device as the one shown in FIG. 1 will be described.

The memory device may read data of selected memory cells for the first time and latch the read data, when the refresh signal REF is activated in a state where the first patrol scrubbing signal PS1 is activated. When the refresh signal REF is activated in a state where the second patrol scrubbing signal PS2 is activated, the memory device may read the data of the selected memory cells for the second time, and compare the second read data to the first read data. The memory device may deactivate the detection signal DET when the first and second read data are equal or substantially equal. The memory device may activate the detection signal DET when the first and second read data both data are not equal or substantially equal. The second detection address PS_CADD<0:3> may be counted whenever a detection operation for the selected memory cells is completed. The first detection address PS_RADD<0:5> may be counted whenever the first address PS_CADD<0:3> is reset to '0000' after reaching '1111'.

When the detection signal DET is deactivated, the first detection address PS_RADD<0:5> may be not latched, but the next detection operation may be performed. When the detection signal DET is activated for the first time, the first detection address PS_RADD<0:5> of '000001' may be stored in the storage unit 230_0 selected by the select signal SEL<0>. When the detection signal DET is activated, the IR enable signal IR_EN may be activated to enable the second refresh operation.

The first read data from the selected memory cells MCs may be rewritten to the selected memory cells MCs. Such an operation is also referred hereinafter as a write back operation and is explained below in more detail.

When the first read data obtained through the first sub-operation are different from the second read data obtained through the second sub-operation, this may be an indication that the data retention times of the selected memory cells MCs are so short that all or part of the stored data has been lost. In this case, the first read data may be written back to restore the data stored in the selected memory cells MCs. The interval between the first and second sub-operations may be shorter than the refresh period. That is because the detection operation is designed to detect memory cells having a shorter data retention time than the refresh period.

When the detection signal DET is activated for the second to fourth times, the first addresses PS_RADD<0:5> of '000110', '001101', and '111111' may be stored in the storage units 230_1 to 230_3 selected by the select signals SEL<1> to SEL<3>.

When the detection operation for the memory cells selected by the first detection address PS_RADD<0:5> of '111111' and the second detection address PS_CADD<0:3> of '1111' is completed, memory cells may be reselected from the memory cells corresponding to the first detection address PS_RADD<0:5> of '000000' and the second detection address PS_CADD<0:3> of '0000', and a detection operation may be performed.

Figure 7:
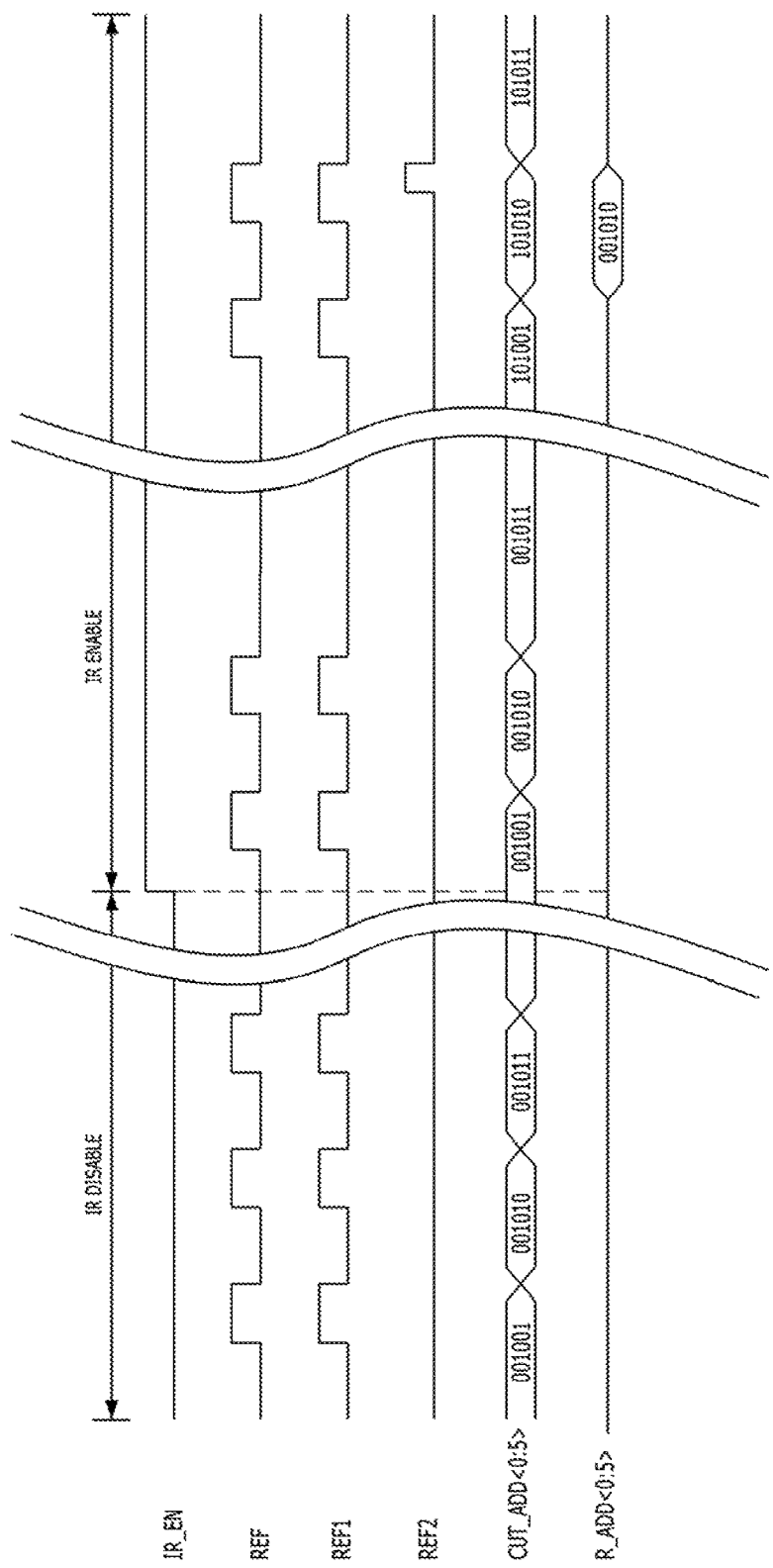
FIG. 7 is a timing diagram for describing a refresh operation of the memory device shown in FIG. 1, according to an embodiment of the present invention.

FIG. 7 is a timing diagram describing the refresh operation of the memory device shown in FIG. 1.

Referring to FIG. 7, the memory device may perform only the first refresh operation of refreshing word lines which are sequentially selected by the counting address CNT_ADD<0:5> when the IR enable signal IR_EN is deactivated (IR DISABLE). After the detection signal DET is activated to store an address in the address storage unit 120, the second refresh operation as well as the first refresh operation may be additionally performed on the address stored in the address storage unit 120 (IR ENABLE).

For example, suppose that the address stored in the address storage unit 120 is '001010'. When the refresh signal REF is activated in a case where the counting address CNT_ADD<0:5> is '001010', the first refresh signal REF1 may be activated, and the word line WL10 may be refreshed through the first refresh operation. Furthermore, since the predetermined bits CNT_ADD<0:4> and SADD<0:4> are 01010, the stored address SADD<0:5> of '001010' may be outputted as the IR address IR_ADD<0:5>. Since the bit CNT_ADD<5> and the bit IR_ADD<5> are equal to 0, the second refresh signal REF2 may not be activated, and the second refresh operation may not be performed.

When the refresh signal REF is activated in a case where the counting address CNT_ADD<0:5> is '101010', the first refresh signal REF1 may be activated, and the word line WL42 may be refreshed through the first refresh operation. Furthermore, since the predetermined bits CNT_ADD<0:4> and SADD<0:4> are '01010', the stored address SADD<0:5> of '001010' may be outputted as the IR address IR_ADD<0:5>. Since the bit CNT_ADD<5> and the bit IR_ADD<5> are different from each other, the second refresh signal REF2 may be activated. Thus, the word line WL10 corresponding to the IR address IR_ADD<0:5> of '001010' may be refreshed through the second refresh operation.

The number of bits, excluding the bits compared to each other in the counting address CNT_ADD and the IR address IR_ADD, may correspond to the number of times the word line corresponding to the IR address IR_ADD is refreshed during the refresh period. More specifically, when the number of bits excluding the bits compared to each other in the counting address CNT_ADD and the IR address IR_ADD is K, the word line corresponding to the IR address IR_ADD may be refreshed $2^K$ times during the refresh period. In the case of the memory device described with reference to FIGS. 1 to 7, the number of bits excluding the bits compared to each other is 1 (IR_ADD<5>). Thus, the word line corresponding to the IR address IR_ADD may be refreshed $2^1$ times during the refresh period. The 'K' may be changed depending on design.

Figure 8A:
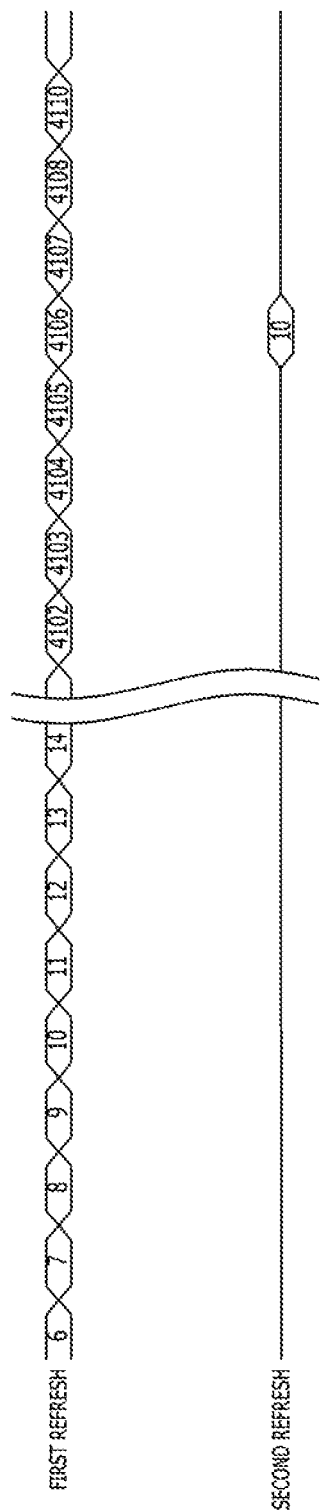
FIGS. 8A to 8C are timing diagrams for describing refresh operations of the memory device shown in FIG. 1, according to an embodiment of the present invention.
Figure 8B:
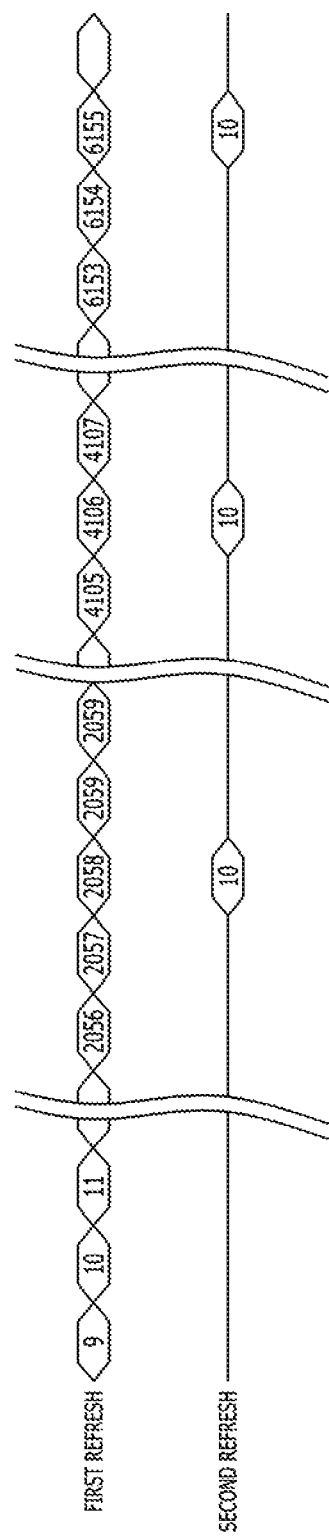
Figure 8C:
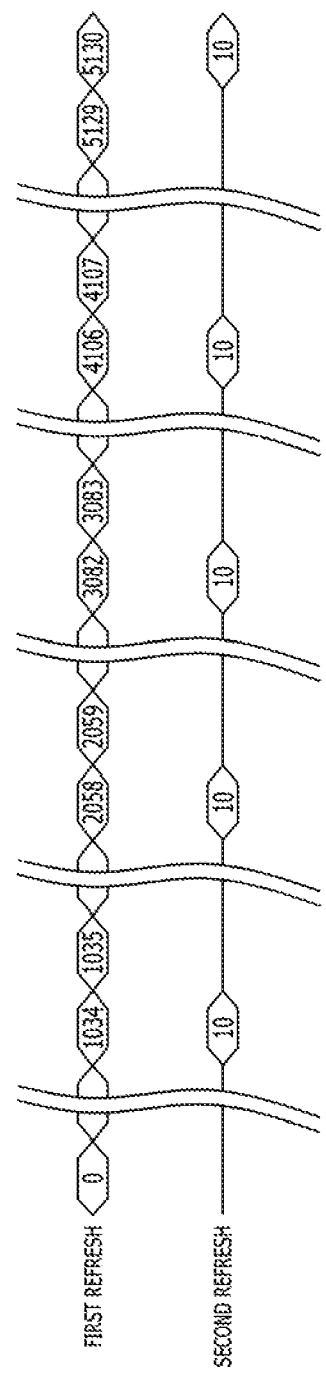

FIGS. 8A to 8C are diagrams describing a refresh operation performed through the same method for the memory device shown in FIG. 1. Hereafter, suppose that the memory device may include 8,196 word lines WL0 to WL8195. Thus, the row address RADD may include a 13-bit signal. Furthermore, suppose that the address of the word line WL10 is detected as '0000000001010' and stored in the address storage unit, during a detection operation.

FIG. 8A is a diagram describing a refresh operation of a detected word line including a first refresh operation and a second refresh operation during the refresh period.

Referring to FIG. 8A, when the counting address CNT_ADD is 10 (i.e., 0000000001010 in a binary code), the word line WL10 may be refreshed through the first refresh operation. When the counting address CNT_ADD is 4106 (i.e., 1000000001010 In a binary code), the word line WL4106 may be refreshed through the first refresh operation and the word line WL10 may be refreshed through the second refresh operation.

FIG. 8B is a diagram describing a refresh operation of a detected word line including one first refresh operation and three second refresh operations during the refresh period.

Referring to FIG. 8B, when the counting address CNT_ADD is 10 (i.e., 0000000001010 in a binary code), the word line WL10 may be refreshed through the first refresh operation. When the counting address CNT_ADD is 2058 (i.e., 0100000001010 in a binary code), the word line WL2058 may be refreshed through the first refresh operation, and the word line WL10 may be refreshed through the second refresh operation. When the counting address CNT_ADD is 4106 (i.e., 1000000001010 in a binary code), the word line WL4106 may be refreshed through the first refresh operation, and the word line WL10 may be refreshed through the second refresh operation. When the counting address CNT_ADD is 6154 (i.e., 1100000001010 in a binary code), the word line WL6154 may be refreshed through the first refresh operation, and the word line WL10 may be refreshed through the second refresh operation.

FIG. 8C is a diagram describing a refresh operation of a detected word line including one first refresh operation and seven second refresh operations during the refresh period.

Referring to FIG. 8C, when the counting address CNT_ADD is 10 (i.e., 0000000001010 in a binary code), the word line WL10 may be refreshed through the first refresh operation. When the counting address CNT_ADD is 1034 (i.e., 0010000001010 in a binary code), the word line WL1034 may be refreshed through the first refresh operation, and the word line WL10 may be refreshed through the second refresh operation. When the counting address CNT_ADD is 2058 (i.e., 0100000001010 in a binary code), the word line WL2058 may be refreshed through the first refresh operation, and the word line WL10 may be refreshed through the second refresh operation. When the counting address CNT_ADD is 3082 (i.e., 0110000001010 in a binary code), the word line WL3082 may be refreshed through the first refresh operation, and the word line WL10 may be refreshed through the second refresh operation. When the counting address CNT_ADD is 4106 (i.e., 1000000001010 in a binary code), the word line WL4106 may be refreshed through the first refresh operation, and the word line WL10 may be refreshed through the second refresh operation. When the counting address CNT_ADD is 5130 (i.e., 1010000001010 in a binary code), the word line WL5130 may be refreshed through the first refresh operation, and the word line WL10 may be refreshed through the second refresh operation. When the counting address CNT_ADD is 6154 (i.e., 1100000001010 in a binary code), the word line WL6154 may be refreshed through the first refresh operation, and the word line WL10 may be refreshed through the second refresh operation. When the counting address CNT_ADD is 7178 (i.e., 1110000001010 in a binary code), the word line WL7178 may be refreshed through the first refresh operation, and the word line WL10 may be refreshed through the second refresh operation.

The memory device described with reference to FIGS. 1 to 8 may detect memory cells of which the data retention times do not reach the reference time, store the addresses of the memory cells, and increase the refresh frequency. Thus, a memory device including memory cells of which the data retention times do not reach the reference time may be normally operated.

Figure 9:
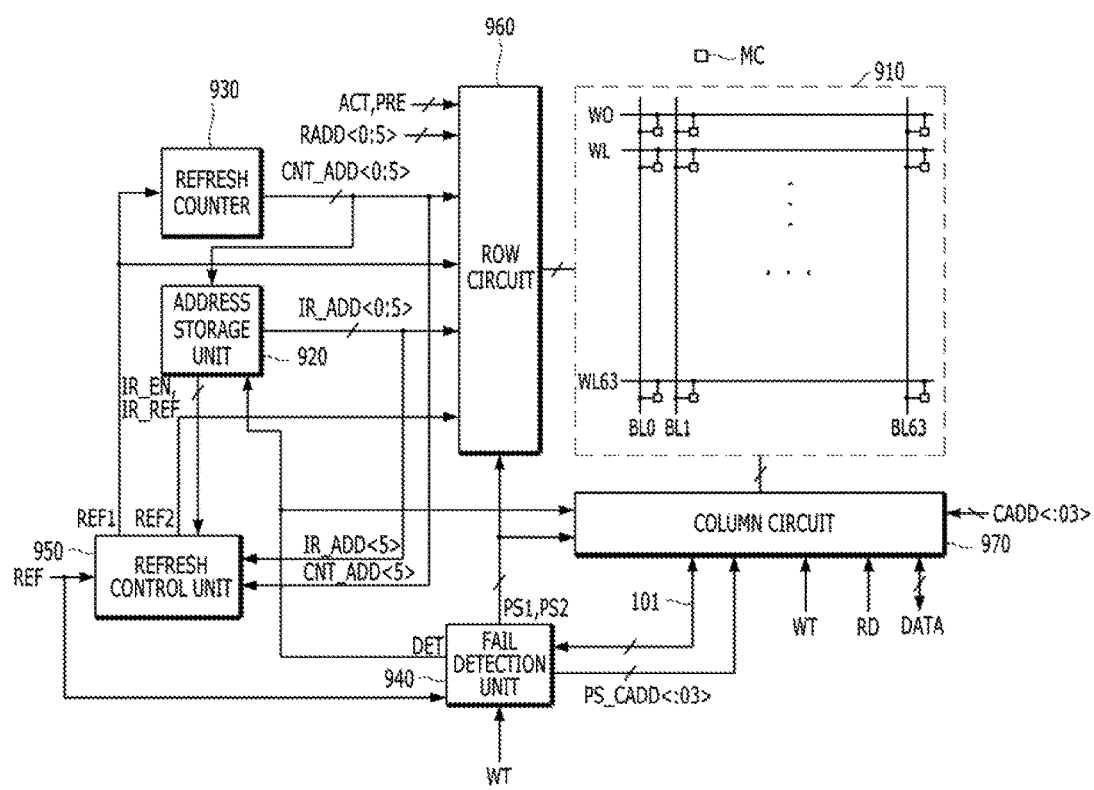
FIG. 9 is a diagram illustrating a memory device, according to an embodiment of the present invention.

Referring now to FIG. 9, another embodiment of a memory device may include a cell array 910, an address storage unit 920, a refresh counter 930, a fail detection unit 940, a refresh control unit 950, a row circuit 960, and a column circuit 970. The memory device shown in FIG. 9 may select a row of memory cells on which a detection operation is to be performed, using a counting address CNT_ADD<0:5>. Thus, unlike the memory device shown in FIG. 1, the memory device shown in FIG. 9 may generate only a second detection address PS_CADD<0:3> for controlling the fail detection unit 940 to select a column. That is, the memory device shown in FIG. 9 may not generate a first detection address PS_RADD<0:5> for controlling the fail detection unit 940 to select a row. Other than the aforementioned differences, a refresh operation of the memory device shown in FIG. 9 may be performed in the same manner as a refresh operation of the memory device shown in FIG. 1, described earlier.

The address storage unit 920 may be operated in the same manner as the address storage unit 120 shown in FIG. 1, except that the address storage unit 920 may store the counting address CNT_ADD<0:5> when a detection signal DET is activated.

The fail detection unit 940 may generate the second detection address PS_CADD<0:3> as a column address. The fail detection unit 940 may increase the second detection address PS_CADD<0:3> by one whenever a fail detection operation for the selected memory cells is completed, and the second detection address PS_CADD<0:3> may be reset after reaching the last value. The fail detection unit 940 may generate first and second patrol scrubbing signals PS1 and PS2 so that the detection operation is performed according to the following sequence.

For example, suppose that a first sub-operation for memory cells coupled to the word line WL0 is started during a first refresh operation of a Kth refresh period where K is a natural number. Furthermore, a second sub-operation for the memory cells coupled to the word line WL0 may be performed during a first refresh operation of a (K+1)th refresh period. As such, when the detection operation for the memory cells coupled to the word line WL0 is performed, the first or second sub-operation may be performed during the first refresh operation of each refresh period, or in a case where the counting address CNT_ADD<0:5> is '000000'. When a detection operation for memory cells coupled to the word line WL1 is performed after the detection operation for the memory cells coupled to the word line WL0 is completed, the first or second sub-operation may be performed during a second refresh operation of each refresh period. Similarly, when a detection operation for memory cells coupled to a word line WLX is performed where X is a natural number, the first or second sub-operation may be performed during an Xth refresh operation of each refresh period or during a refresh operation in which the counting address CNT_ADD<0:5> has a value corresponding to the word line WLX.

The detection operation of the memory device shown in FIG. 9 may be performed in the same manner as the detection operation of the memory device shown in FIG. 1, except that the first and second sub-operations are performed according to the above-described sequence.

The row circuit 960 may control active and precharge operations of a word line selected by a row address RADD<0:5>, the counting address CNT_ADD<0:5>, or an IR address IR_ADD<0:5>. The row circuit 960 may refresh a word line corresponding to the counting address CNT_ADD<0:5> when the first refresh signal REF1 is activated, and refresh a word line corresponding to the IR address IR_ADD<0:5> when the second refresh signal REF2 is activated.

Figure 10:
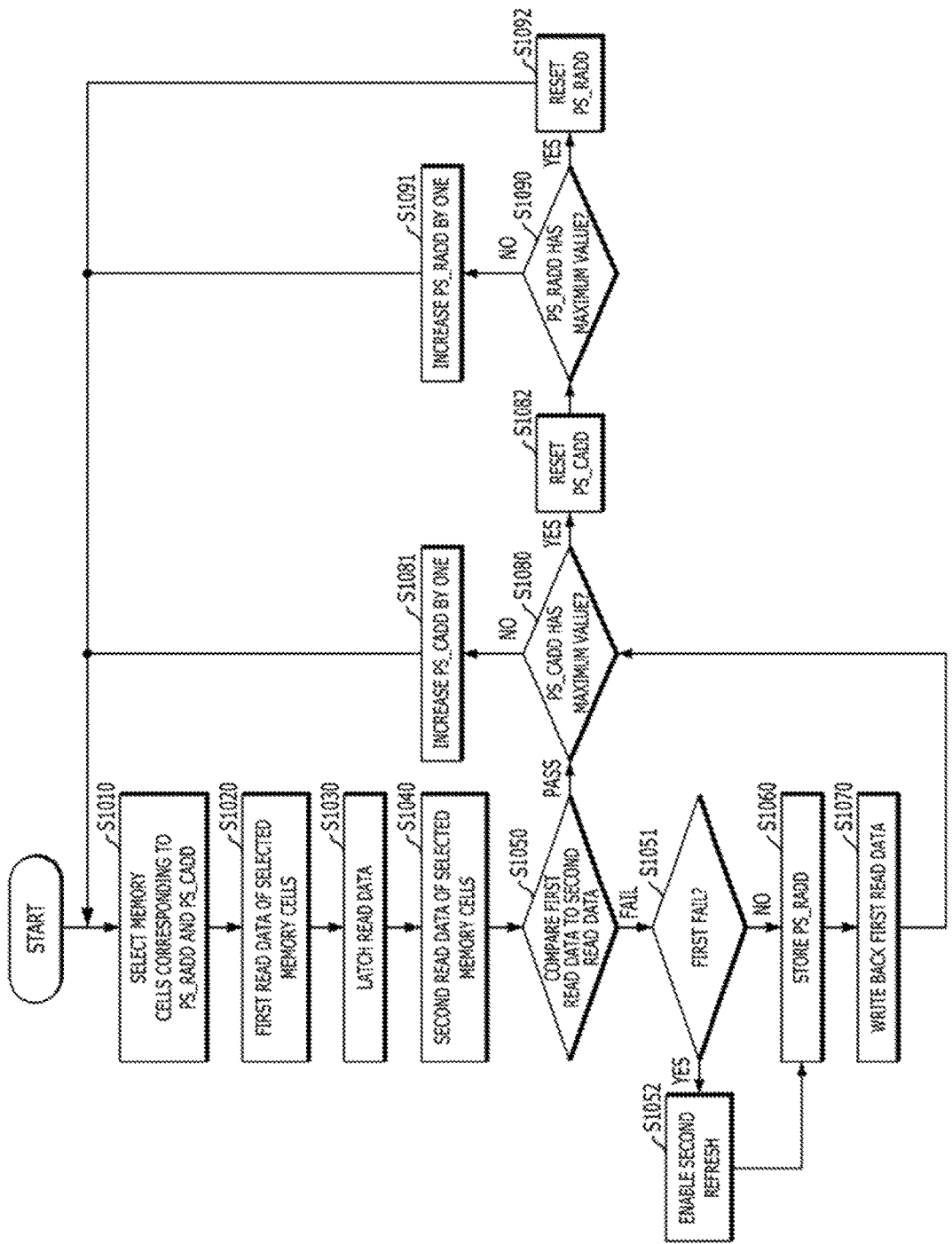
FIGS. 10 to 12 are flowcharts for describing operations of the memory device shown in FIG. 1, according to an embodiment of the present invention.

FIG. 10 is a flowchart describing an operation of the memory device shown in FIG. 1, according to an embodiment of the invention.

At step S1010, the memory device may select memory cells corresponding to first and second detection addresses PS_RADD and PS_CADD among a plurality of memory cells. At step S1020, the memory device may read data of the selected memory cells for the first time. At step S1030, the memory device may latch the first read data in the fail detection unit 140.

After a predetermined time elapses, the memory device may read the data of the selected memory cells for the second time at step S1040. At step S1050, the memory device may compare the latched data to the second read data. When the latched data and the second read data are different (i.e. not equal or substantially equal), the memory device may determine that a fail has occurred (FAIL). When the latched data and the second read are equal or substantially equal, the memory device may determine that no fail has occurred (PASS).

When it is determined at step S1050 that the fail has occurred, the memory device may detect whether the fail is a first fail at step S1051. When the fail is a first fail, the memory device may enable the second refresh operation at step S1052 (YES), and proceed to step S1060. When it is detected at step S1051 that the fail is not a first fail, the procedure may proceed to step S1060 (NO). When the second refresh operation is enabled, it may indicate that the IR enable signal IR_EN is activated. At step S1060, the memory device may store the first detection address PS_RADD in the address storage unit 120. At step S1070, the memory device may write back the first read data to the selected memory cells.

When no fail is detected or the write back operation is completed, the memory device may determine whether the second detection address PS_CADD has reached a maximum value, at step S1080. When the second detection address PS_CADD does not have the maximum value (NO), the memory device may increase the value of the second detection address PS_CADD by one at step S1081, and proceed to step S1010. When the second detection address PS_CADD has reached the maximum value (YES), the memory device may reset the second detection address PS_CADD at step S1082. At step S1090, the memory device may determine whether the first detection address PS_RADD has reached a maximum value. When the first detection address PS_RADD does not have the maximum value (NO), the memory device may increase the value of the first detection address PS_RADD by one at step S1091, and proceed to the step S1010. When the first detection address PS_RADD has the maximum value (YES), the memory device may reset the first address PS_CADD at step S1092, and proceed to the step S1010.

Figure 11:
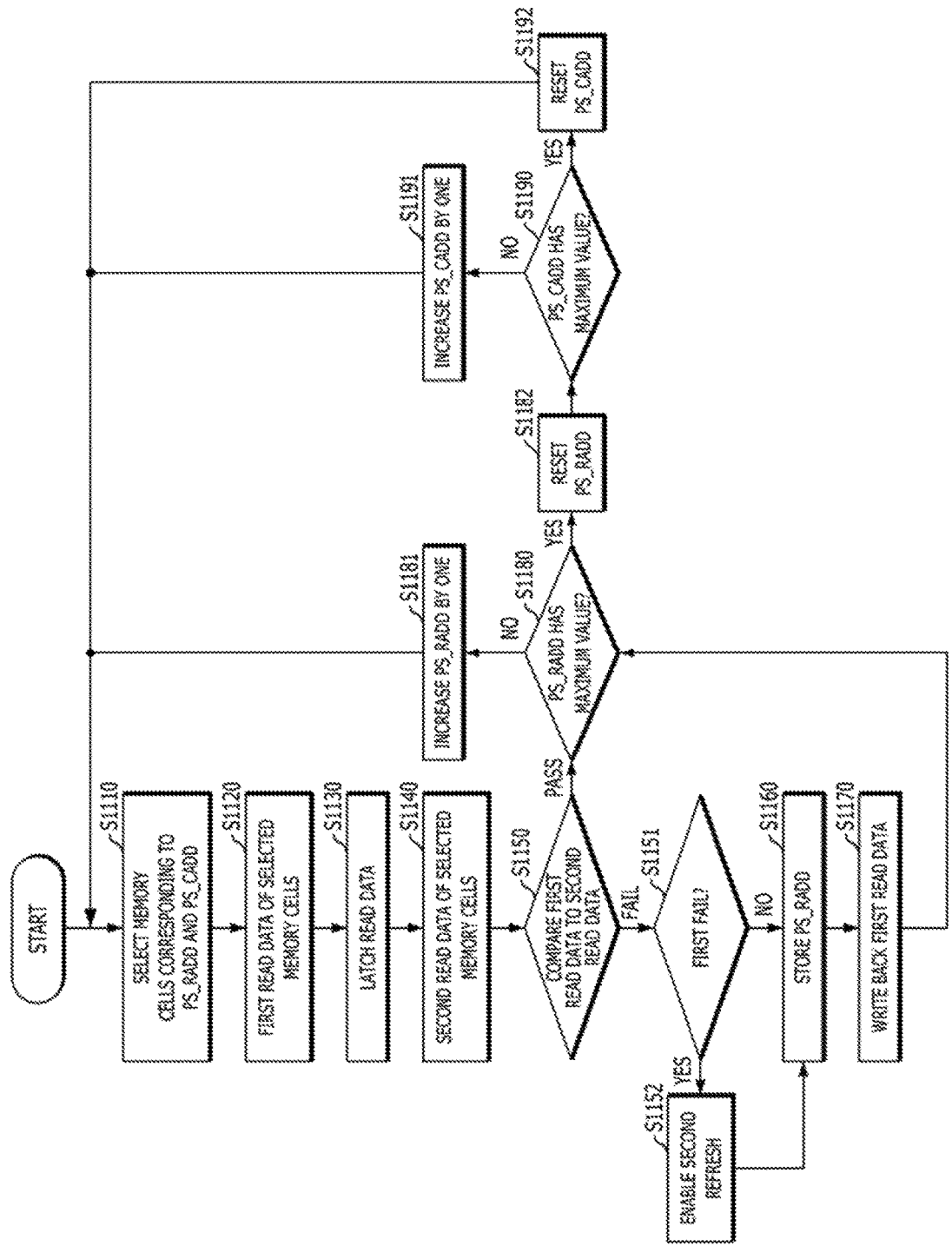

FIG. 11 is a flowchart describing another operation of the memory device shown in FIG. 1, according to an embodiment of the invention.

At step S1110, the memory device may select memory cells corresponding to the first and second addresses PS_RADD and PS_CADD among a plurality of memory cells. At step S1120, the memory device may read data of the selected memory cells may be read for the first time. At step S1130, the memory device may latch the first read data in the fail detection unit 140.

After a predetermined time elapses, the memory device may read the data of the selected memory cells for the second time at step S1140. At step S1150, the memory device may compare the latched data to the second read data. When the latched and the second read data are different, the memory device may determine that a fail has occurred (FAIL). When the latched and the second read data are equal or substantially equal to each other, the memory device may determine that no fail has occurred (PASS).

When the fail is detected, the memory device may determine whether the fail is a first fail, at step S1151. When the fail is a first fail (YES), the memory device may enable the second refresh operation at step S1152, and proceed to step S1160. When the fail is not a first fail (NO), the memory device may proceed to the step S1160. When the second refresh operation is enabled, it may indicate that the IR enable signal IR_EN is activated. When the fail is detected, the memory device may store the first detection address PS_RADD in the address storage unit 120. At step S1170, the memory device may write back the first read data to the selected memory cells.

When no fail is detected or the write back operation is completed, the memory device may determine whether the first detection address PS_RADD has the maximum value, at step S1180. When the first detection address PS_RADD does not have the maximum value (NO), the memory device may increase the value of the first detection address PS_RADD by one at step S1181, and then proceed to the step S1110. When the first detection address PS_RADD has the maximum value (YES), the memory device may reset the first detection address PS_RADD at step S1182. At step S1190, the memory device may determine whether the second detection address PS_CADD has the maximum value. When the second detection address PS_CADD has the maximum value (NO), the memory device may increase the value of the second detection address PS_CADD by one at step S1191, and then proceed to the step S1110. When the second detection address PS_CADD has the maximum value (YES), the memory device may reset the second detection address PS_CADD at step S1192, and then proceed to the step S1110.

Figure 12:
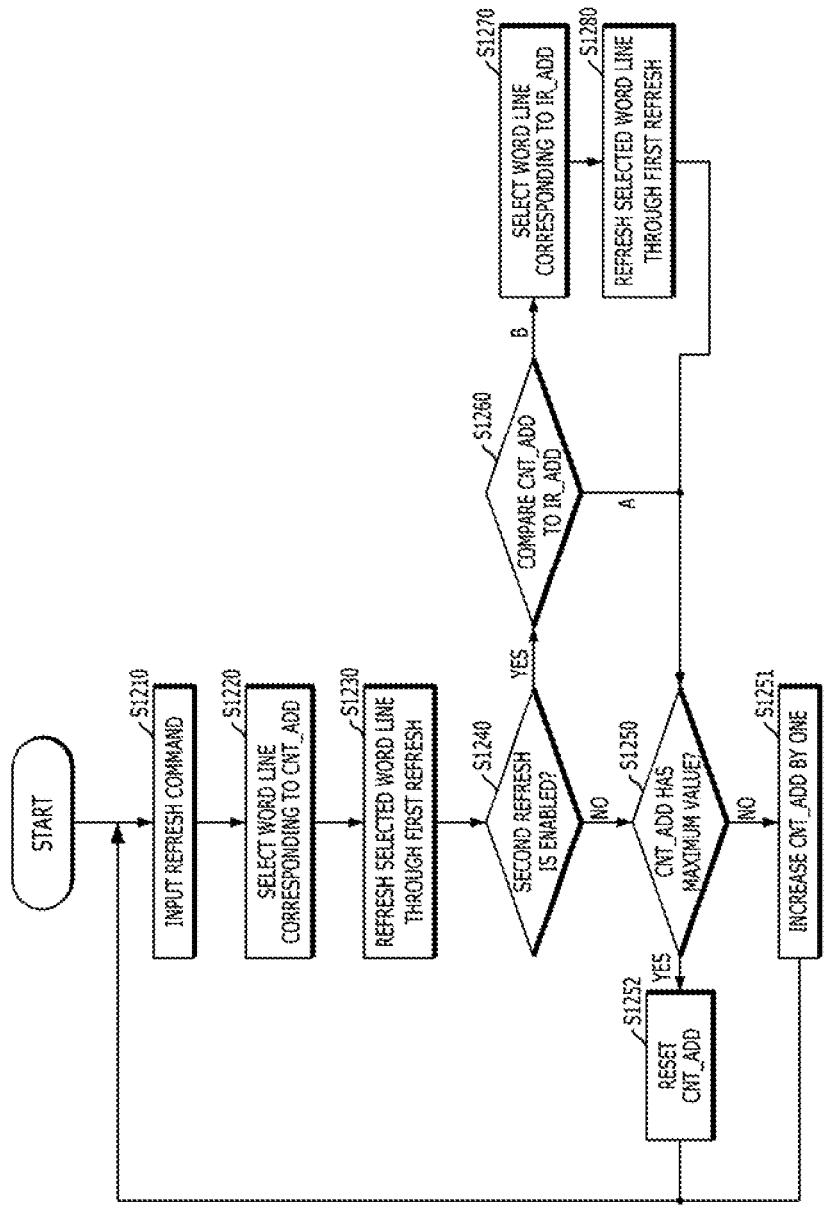

FIG. 12 is a flowchart describing another operation of the memory device shown in FIG. 1, according to an embodiment of the invention.

At step S1210, a refresh command may be inputted. At step S1220, the memory device may select a word line corresponding to a counting address CNT_ADD. At step S1230, the memory device may refresh the word line through the first refresh operation. At step S1240, the memory device may determine whether the second refresh operation is enabled. When the second refresh operation is not enabled (NO), the memory device may proceed to step S1250. At step S1250, the memory device may determine whether the counting address CNT_ADD has the maximum value. When the counting address CNT_ADD does not have the maximum value (NO), the memory device may increase the value of the counting address CNT_ADD by one at step S1251, and then proceed to the step S1210. When the counting address CNT_ADD has the maximum value (YES), the memory device may reset the counting address CNT_ADD at step S1252, and then proceed to the step S1210.

When it is determined at step S1240 that the second refresh operation is enabled (YES), the memory device may compare the counting address CNT_ADD and the IR address IR_ADD at step S1260. When all bits of the counting address CNT_ADD and the IR address IR_ADD are equal to each other or one or more bits among the predetermined bits CNT_ADD<0:4> and IR_ADD<0:4> are different from each other (A), the memory device may proceed to the step S1250. When the predetermined bits CNT_ADD<0:4> and IR_ADD<0:4> are equal to each other and only the bits CNT_ADD<5> and IR_ADD<5> are different from each other, the memory device may proceed to S1270 to select a word line corresponding to the IR address IR_ADD. At step S1280, the memory device may refresh the selected word line through the second refresh operation, and then proceed to the step S1250.

Figure 13:
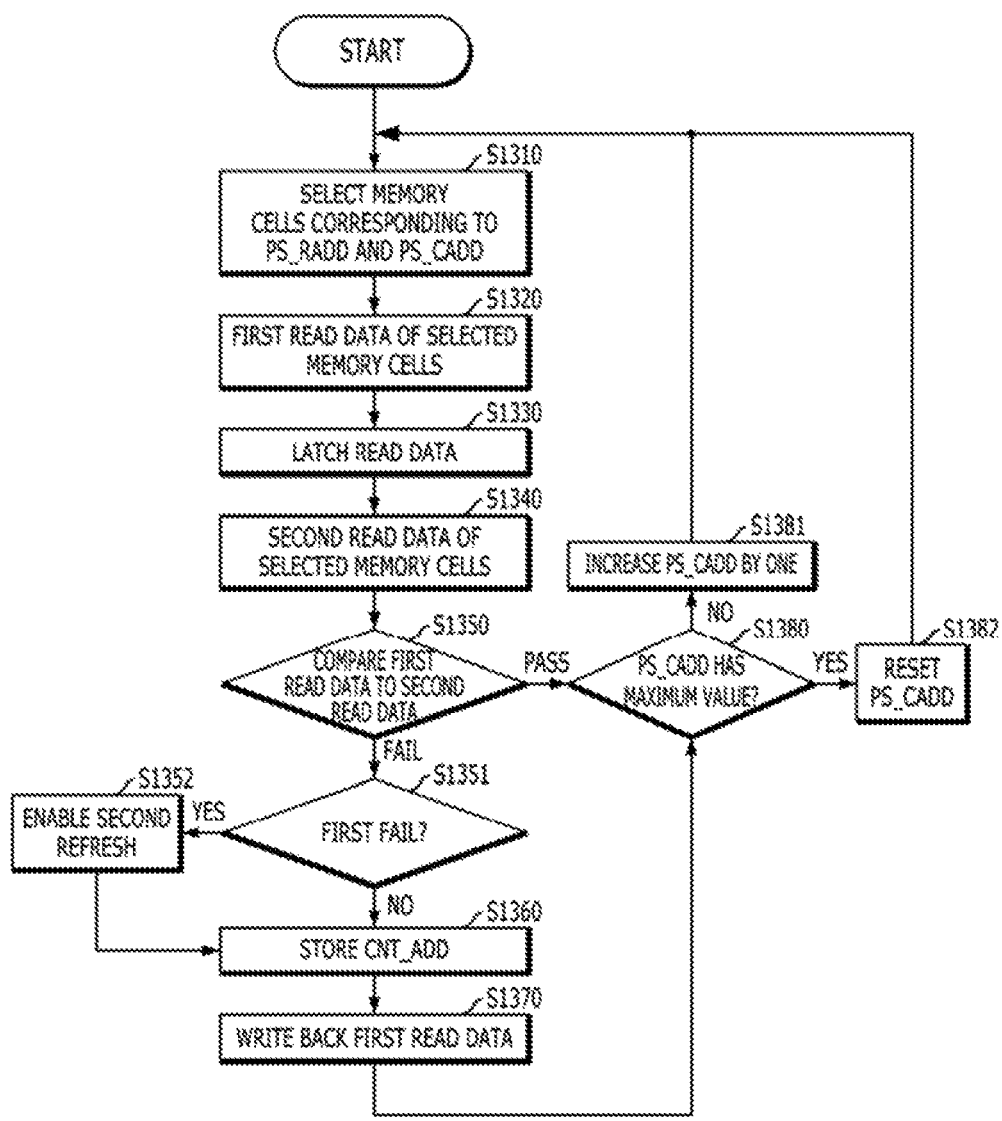
FIG. 13 is a flowchart for describing an operation of the memory device shown in FIG. 9, according to an embodiment of the present invention.

FIG. 13 is a flowchart describing yet another operation of the memory device shown in FIG. 9, according to an embodiment of the invention.

At step S1310, the memory device may select memory cells corresponding to the counting address CNT_ADD and the second detection address PS_CADD among a plurality of memory cells. At step S1320, the memory device may read data of the selected memory cells for the first time. At step S1330, the memory device may latch the first read data in the fail detection unit 940.

After a predetermined time elapses, the memory device may read the data of the selected memory cells for the second time at step S1340. At step S1350, the memory device may compare the latched data to the second read data. When the latched and the second read data are equal or substantially equal, the memory device may determine that a fail has occurred (FAIL). When the latched and the second read data are different, the memory device may determine that no fail has occurred (PASS).

When the fail is detected, the memory device may determine whether the fail is a first fail, at step S1351. When the fail is a first fail (YES), the memory device may enable the second refresh operation at step S1352, and proceed to step S1360. When the fail is not a first fail, the memory device may proceed to the step S1360 (NO). When the second refresh operation is enabled, it may indicate that the IR enable signal IR_EN is activated. At step S1360, the counting address CNT_RADD may be stored in the address storage unit 920. At step S1370, the first read data may be written back to the selected memory cells.

When no fail is detected or the write back operation is completed, the memory device may determine whether the second detection address PS_CADD has the maximum value, at step S1380. When the second detection address PS_CADD does not have the maximum value (NO), the memory device may increase the value of the second detection address PS_CADD by one at step S1381, and then proceed to the step S1310. When the second detection address PS_CADD has the maximum value (YES), the memory device may reset the second detection address PS_CADD at step S1382, and then proceed to the step S1310. The counting address CNT_ADD may be counted while the refresh operation of the memory device is performed independently of the detection operation.

According to embodiments of the present invention, the refresh operation of the memory device may be controlled to normally operate memory cells of which the data retention times do not reach a predetermined reference time.

Although various embodiments have been described for illustrative purposes, it will be apparent to those skilled in the art that various changes and modifications may be made without departing from the spirit and scope of the invention as defined in the following claims.

What is claimed is:
1. A memory device comprising:
   a plurality of memory cells;
   a plurality of rows coupled to the memory cells;
   a fail detection unit suitable for comparing first and second read data that are read from at least one memory cell selected among the plurality of memory cells to detect a fail;
   at least one address storage unit suitable for storing an address of the selected memory cell when the fail is detected at the fail detection unit; and
   a refresh control unit suitable for controlling to refresh the plurality of memory cells based on a refresh command, wherein the memory cell corresponding to the address stored in the address storage unit is refreshed at a higher frequency than the other memory cells by allowing an additional refresh operation to be performed on the memory cell,
wherein a row address corresponding to the selected memory cell is stored in the address storage unit, when the fail is detected, and
wherein the rows are sequentially refreshed through a first refresh operation, and a row corresponding to the row address stored in the address storage unit is refreshed one or more times through a second refresh operation performed as the additional refresh operation while the rows are refreshed once through the first refresh operation.

2. The memory device of claim 1, wherein the fail detection unit comprises a data latch unit suitable for latching the first read data, and compares the latched first read data to the second read data.

3. The memory device of claim 1, wherein the fail detection unit writes the first read data back to the selected memory cell, when the fail is detected.

4. The memory device of claim 1, wherein the fail detection unit detects a fail when the first read data and the second read data are not substantially equal.

5. The memory device of claim 1, wherein the second read data is read at a predetermined time after the first read data are read.

6. The memory device of claim 5, wherein the first read data and the second read data are read through different refresh operations.

7. The memory device of claim 1, wherein the fail detection unit sequentially selects the memory cells to detect the fail.

8. The memory device of claim 1, further comprising a refresh counter suitable for generating a counting address,
wherein a row corresponding to the counting address is refreshed through the first refresh operation based on the refresh command, and the row corresponding to the row address stored in the address storage unit is refreshed through the second refresh operation, when predetermined bits of the counting address are substantially equal to predetermined bits of the row address stored in the address storage unit.

9. A memory device comprising:
a plurality of rows coupled to a plurality of memory cells;
a refresh counter suitable for generating a counting address;
a fail detection unit suitable for comparing first and second read data that are read from at least one selected memory cell coupled to a row corresponding to the counting address to detect a fail;
at least one address storage unit suitable for storing the counting address when the fail is detected at the fail detection unit; and
a refresh control unit suitable for controlling to refresh the plurality of rows based on a refresh command, wherein a row corresponding to the stored counting address is refreshed at a higher frequency than the other rows by allowing an additional refresh operation to be performed on the row,
wherein a row corresponding to the counting address is refreshed through a first refresh operation based on the refresh command, and a row corresponding to a row address stored in the address storage unit is refreshed through a second refresh operation performed as the additional refresh operation, when predetermined bits of the counting address are equal to predetermined bits of the row address stored in the address storage unit.

10. The memory device of claim 9, wherein the fail detection unit comprises a data latch unit suitable for latching the first read data, and compares the latched first read data to the second read data.

11. The memory device of claim 9, wherein the fail detection unit controls the first read data to be written back to the selected memory cells when the fail is detected.

12. The memory device of claim 9, wherein the fail detection unit generates a detection address for selecting the memory cells coupled to the row corresponding to the counting address, and a value of the detection address is changed when data is read from the selected memory cell for the second time.

13. An operating method of a memory device including a plurality of memory cells, the method comprising:
selecting, by a row circuit and a column circuit, at least one memory cell;
first reading, by a fail detection unit, data of the selected memory cell;
second reading, by the fail detection unit, the data of the selected memory cell after a predetermined time elapses;
comparing, by the fail detection unit, the first read data and the second read data to detect a fail;
storing, by an address storage unit, an address of the selected memory cells when the fail is detected; and
refreshing, by a refresh control unit, the plurality of memory cells based on a refresh command, wherein the memory cell corresponding to the stored address is refreshed at a higher frequency than the other memory cells by performing an additional refresh operation,
wherein the memory device further includes a plurality of rows coupled to the memory cells, and the storing of the address of the selected memory cells comprises storing a row address corresponding to the selected memory cell, and
wherein the refreshing of the memory cells comprises:
sequentially refreshing the rows through a first refresh operation, during a refresh period; and
refreshing a row corresponding to the stored row address one or more times through a second refresh operation performed as the additional refresh operation, during the refresh period.

14. The operating method of claim 13, further comprising latching the first read data.

15. The operating method of claim 14, wherein, in the comparing of the first read data and the second read data, it is determined that no fail is detected when the latched data and the second read data are substantially equal.

16. The operating method of claim 13, further comprising writing the first read data back to the selected memory cell when the fail is detected.

17. The operating method of claim 13, wherein the first reading of the data and the second reading of the data are performed through different refresh operations.

18. The operating method of claim 13, wherein the refreshing of the memory cells comprises:
changing a value of a counting address whenever the row is refreshed; and
refreshing a row corresponding to the counting address through the first refresh operation based on the refresh command, and refreshing a row corresponding to the stored row address through the second refresh operation, when predetermined bits of the counting address are equal to predetermined bits of the stored row address.

* * * * *